United States Patent
Becher et al.

(10) Patent No.: US 6,772,813 B2
(45) Date of Patent: Aug. 10, 2004

(54) REMOVABLE HEATED END EFFECTOR

(75) Inventors: Christopher Becher, Phoenix, AZ (US); Ovidiu Neiconi, Boynton Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 32 days.

(21) Appl. No.: 10/328,231

(22) Filed: Dec. 23, 2002

(65) Prior Publication Data

US 2004/0118522 A1 Jun. 24, 2004

(51) Int. Cl.[7] .............................................. B32B 31/00
(52) U.S. Cl. ...................... 156/571; 156/572; 156/584
(58) Field of Search ................................ 156/556, 571, 156/572, 344, 584

(56) References Cited

U.S. PATENT DOCUMENTS

| | | | | |
|---|---|---|---|---|
| 4,659,004 A | * | 4/1987 | Fridman ..................... | 228/6.2 |
| 4,752,025 A | * | 6/1988 | Stach et al. ................... | 228/9 |
| 4,767,047 A | * | 8/1988 | Todd et al. .................. | 228/6.2 |
| 4,890,241 A | * | 12/1989 | Hoffman et al. ............ | 700/255 |
| 5,072,874 A | * | 12/1991 | Bertram et al. ............. | 228/264 |
| 5,164,037 A | * | 11/1992 | Iwami et al. ............... | 156/584 |
| 5,425,833 A | * | 6/1995 | Fujimoto et al. ........... | 156/344 |
| 5,598,965 A | * | 2/1997 | Scheu ......................... | 228/6.2 |
| 5,971,250 A | * | 10/1999 | Safabakhsh et al. ........ | 228/102 |
| 6,129,476 A | * | 10/2000 | Berman et al. ............. | 403/229 |

* cited by examiner

Primary Examiner—Mark A. Osele
(74) Attorney, Agent, or Firm—Michelle Larson

(57) ABSTRACT

A replaceable heated end effector (100) can be quickly connected and disconnected to a vacuum ported tool changer (199) on a high speed machine for picking and placing electronic components. The modular end effector is made up of an adapter flange (110), a heater plate (120) and a heated tip (130). The heater plate contains one or more heating elements (410) to heat up the tip. The upper side (112) of the adapter flange mates with the vacuum ported tool changer so as to be easily removable. The adapted flange also has electrical contacts (142) to supply power to the heating elements on the heater plate. The heated tip has a vacuum pickup portion (132) that is designed to pick up the electronic components (198) and heat them while they are being transported to the placement location. There are holes or apertures (115, 125, 135) in the adapter flange, the heater plate and the heated tip that port the vacuum from the tool changer to the vacuum pickup tip. The adapter flange, the heater plate and the heated tip are all fastened together in close proximity to form a modular unit that can be easily and removably connected to the tool changer.

17 Claims, 2 Drawing Sheets

REMOVABLE HEATED END EFFECTOR

This invention was made with United States Government support under Agreement No. 70NANB8H4007 awarded by the National Institute of Standards and Technology (NIST). The United States Government has certain rights in the invention.

FIELD OF THE INVENTION

This invention relates generally to automated placement of small electronic components. More particularly, this invention relates to the use of a heated end effector on placement systems to preheat an adhesive on electronic components.

BACKGROUND OF THE INVENTION

"Chip shooters" or "Pick-and-Place" machines rapidly place components such as resistors, capacitors and integrated circuit packages on a circuit board. The placement of components on the board can reach rates of more than 40,000 chips per hour. These machines pick up and accurately locate the component on the end of a vacuum nozzle. Chip shooters use one of two basic designs to place components. The most common is a turret drive with multiple heads around the outside of the turret A feeder carriage is place in the back of the machine that moves back and forth to put the correct component under the turret. As the turret spins, the component is picked up from the feeder carriage and is brought to the front for placement. The advantage of the turret design is speed since many components can be on the turret in process at the same time. The circuit board being assembled moves around under the front of the turret to position the component correctly. A second type of chip shooter is a gantry system. The circuit board is held stationary, or moved in only one axis, and the head goes to the feeder to get the component and moves to the proper location for placement.

When placing flip chip integrated circuits that are pre-coated with an underfill, solder flux or solder paste is not used to hold the chip in place during reflow, as with typical surface mount components. Instead the pre-applied underfill material needs to be heated to soften the material and create a tacky surface to hold the chip in place as the board is transported into the reflow oven. Novel techniques such as a soft beam laser, radiant or ultraviolet heating for the softening step after component pick and placement are being discussed as a potential techniques for heating up the flip chip. However, these techniques have not been proven to be effective for mass production. An alternative approach is to heat the board with infra-red energy prior to entering the placement cell. While this technique can easily be integrated in an existing pick and place platform, it causes the solder paste on the printed circuit boards to dry out. Therefore a method of heating the die during the pick and place step is highly desirable to provide a complete solution for the implementation of the precoated chip in high volume manufacturing.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

The invention provides a high volume solution to enable the integration of a tacking material pre-applied to chips in high volume manufacturing. A replaceable heated end effector can be quickly connected and disconnected to a vacuum ported tool changer on a high speed machine for picking and placing electronic components. The modular end effector is made up of an adapter flange, a heater plate and a heated tip. The heater plate contains one or more heating elements to heat up the tip. The upper side of the adapter flange mates with the vacuum ported tool changer so as to be easily removable. The adapted flange also has electrical contacts to supply power to the heating elements on the heater plate. The heated tip has a vacuum pickup portion that is designed to pick up the electronic components and heat them while they are being transported to the placement location. There are holes or apertures in the adapter flange, the heater plate and the heated tip that port the vacuum from the tool changer to the vacuum pickup tip. The adapter flange, the heater plate and the heated tip are all fastened together in close proximity to form a modular unit that can be easily and removably connected to the tool changer.

Figure 1:
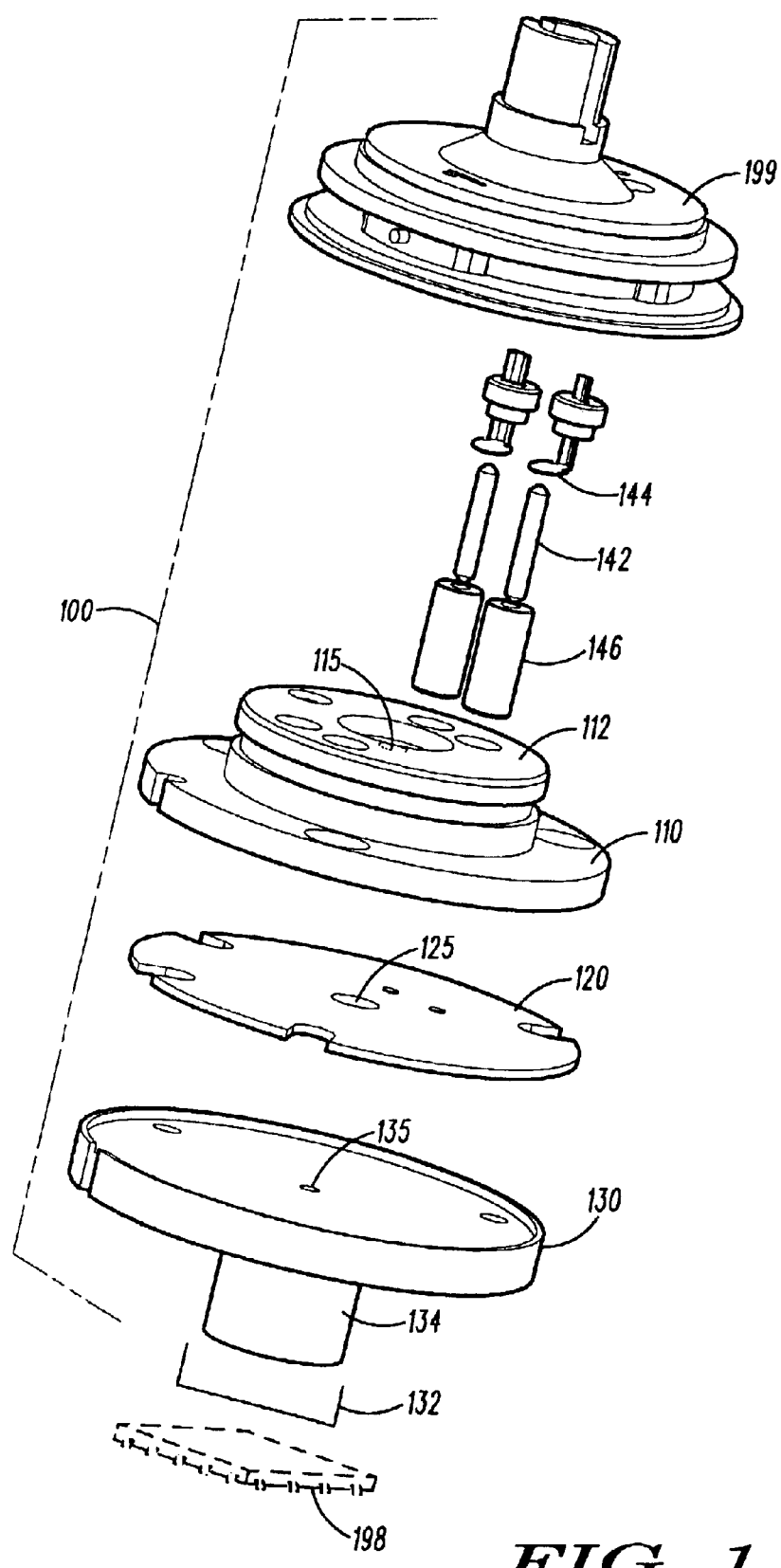
FIG. 1 is an exploded isometric view of one embodiment of the present invention.
Figure 4:
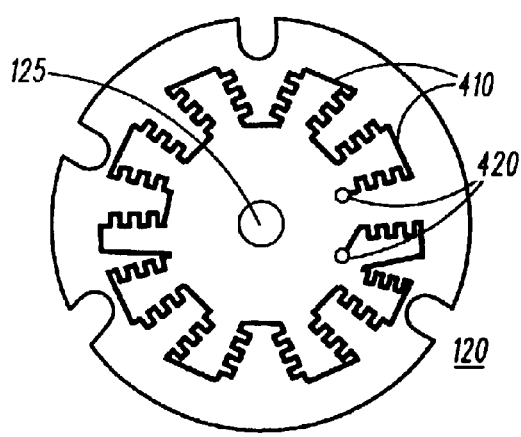
FIG. 4 is a plan view of one example of a heater plate in accordance with the invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings. Referring now to FIGS. 1 and 4, in which our preferred embodiment is displayed, the replaceable heated end effector 100 contains three main parts: an adapter plate or flange 110, a heater plate 120 and a heated vacuum tip 130. The aluminum adapter flange 110 is arranged such that an upper side 112 mates with a corresponding portion of the vacuum ported tool changer 199 that is part of the pick and place mechanism of any of a number of conventional robotic placement machines or high speed pick and place machines. It is advantageous to design the adapter flange so that a human operator can easily connect and disconnect it from the tool changer, and thus our design contains a groove in the adapter flange 110 that mates with a circumferential spring in the tool changer 199, allowing it to be securely snapped in place and also to be easily removed. The adapter plate 110 is preferably made of aluminum to minimize the mass of the plate, as it is subject to very high rates of acceleration during use. However, on slower systems, one could use other metals or even some materials that are thermal and electrical insulators, as long as they are capable of withstanding high temperatures. A heater plate 120 is situated directly below the adapter flange 110 and arranged so that it mates with the flange. The heater plate 120 contains one or more heating elements 410 that are electrically connected to heater contacts 420. Heating element 410 can be a single resistive element, or it can be multiple elements arranged in an array or connected in series or parallel, as is well known in the heating art. The heater contacts 420 mate with electrically conductive contact pins 142 that are located in the adapter flange 110. If the adapter flange is made of a metal or other electrical conductor, then the contact pins 142 need to be electrically insulated from each other and from the flange by a dielectric material 146 such as a sheath, coating or other member. The contact pins 142 extend through the adapter flange 110 so as to mate at one end to the heater contacts 420 and to a spring contact 144 at the other end. Spring contacts 144 are located in the tool changer to provide compression force to maintain the electrical contact to the contact pins 142. In practice, we find that one needs to modify the tool changer slightly to accommodate the modular heated end effector by adding two holes for the spring contacts. Also, we have found that replacing the tool changer 199 with an exact replica made from a heat resistant material such as metal is advantageous, but may not be necessary in all cases, depending on the construction of the tool changers on the various industrial placement machines.

The adapter flange 110 and the heater plate 120 both mate with and are attached to a heated tip 130 that has a vacuum pickup portion 132 that is designed in the manner of conventional vacuum pickup tool tips, to apply a vacuum force to pick up the electronic components 198. A vacuum is transmitted to the tip via a port or aperture 135 in the tip. This port is arranged to communicate with a corresponding aperture 125 in the heater plate 120, and the heater aperture 125 is also arranged to communicate with a corresponding aperture 115 in the adapter flange 110. All three apertures 135, 125 and 115 also are arranged to communicate with the vacuum that is ported to the tool changer 199. In practice, we find that the simplest design is to make the vacuum apertures 115, 125 and 135 coaxial, but one can port the vacuum in a variety of ways and channels. As depicted in the drawing, the vacuum pickup 132 is a protrusion 134 or other type of tip that extends out from the body of the heated tip, bust depending on the circumstances, that is not a requirement. For instance, the vacuum pickup portion 132 could simply be a hole in the body of the heated tip 130, where the bottom portion of the heated tip is a plane. However, in practice, most practioners seem to prefer that an extension of some sort be employed. The heated tip 130 is preferably made of aluminum or other material that is light and highly thermally conductive, so as to quickly conduct heat to the electronic component 198 that is being picked up. When the heated tip 132 makes contact with the electronic component 198 such as a flip chip that has been pre-coated with an underfill material and vacuum is applied through the apertures 115, 125 and 135, the component is held against the vacuum pickup portion 132 by vacuum force. While in intimate contact with the heated tip, a finite amount of heat is transferred to the flip chip and the preapplied underfill material on the flip chip softens to become tacky. This, in turn, secures the chip when it is placed on the printed circuit board, to maintain alignment as the board is transported into the reflow oven.

Figure 2:
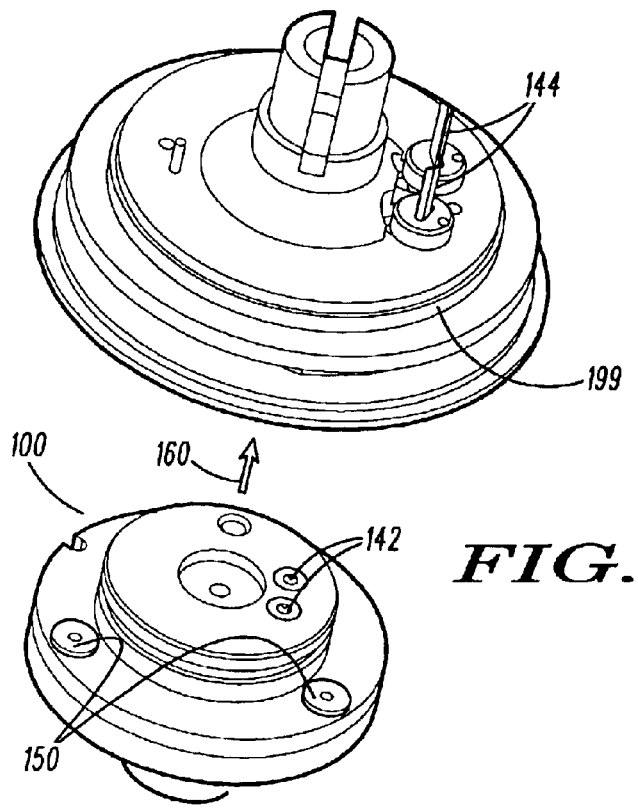
FIG. 2 is another isometric view showed the assembled end effector ready to mate with the tool changer on a placement machine in accordance with the present invention.
Figure 3:
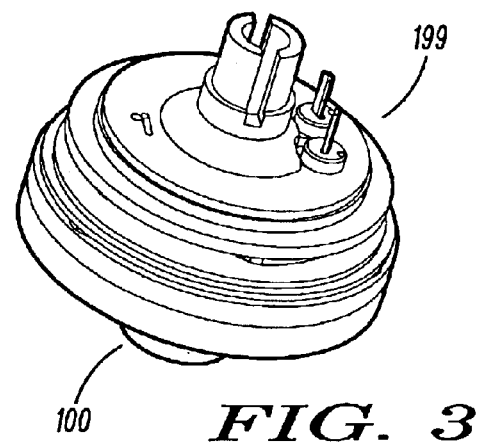
FIG. 3 is an isometric view of an end effector mated with the tool changer on a placement machine in accordance with the present invention.

Referring now to FIG. 2, the three main parts of the end effector 100 have been assembled and are held together, for example, by fastening means 150. Various fastening means can be employed, such as rivets, screws, adhesives, welds, etc., and the invention is not intended to be limited by the selection of any particular fastening means. Note that the assembled end effector 100 mates in the direction of the arrow 160 to the tool changer 199 on the placement machine and that the spring contacts 144 extend through the top of the body of the tool changer and mate with the ends of the contact pins 142. FIG. 3 shows the heated end effector 100 completely mated with the tool changer 199.

In summary, and without intending to limit the scope of the invention, a replaceable heated end effector can be quickly connected and disconnected to a vacuum ported tool changer on a conventional high speed machine for picking and placing electronic components. The modular end effector is made up of an adapter flange, a heater plate and a heated tip. A vacuum pickup on the heated tip picks up the electronic components and heats them while they are being transported to the placement location. The adapter flange, the heater plate and the heated tip are all fastened together in close proximity to form a modular unit that can be easily and removably connected to the tool changer. Our invention utilizes heater technology that enables a steady state heater to be embedded in a small tip. The design of the changeable tip is the key to its versatility for high volume production. When the tip is snapped into the tool changer, power transmission to the embedded heater is accomplished through a pin contacting two spring clips on the bottom of the tool changer. Optionally, an additional spring clip, also on the bottom of the tool changer, contacts a thermocouple for process control. Those skilled in the art will recognize that the present invention has been described in terms of exemplary embodiments based upon one type of tool changer used in a high speed placement machine or chip shooter. However, the invention should not be so limited, since other variations will occur to those skilled in the art upon consideration of the teachings herein. For example, one can also embed a thermocouple in the end effector assembly to monitor the temperature of the heated tip. Additionally, one can use a variety of controllers to provide proportional control of the heaters to precisely control the temperature of the heated tip. In addition to the tip design, a unique method of routing the electrical cabling and pneumatic port to the tool changer via a rotary connector that gives complete rotational freedom can optionally be employed. The rotary electrical system with pneumatics allows free rotation of the theta axis, and does not impact the placement accuracy. The connector is mounted on top of a uniquely designed shaft which is machined to route the cables and port for the vacuum to the end of the tool changer. While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. In a high speed machine for picking and placing electronic components, a replaceable heated end effector for connection to a vacuum ported tool changer, comprising:

an adapter flange, a heater plate and a heated tip;

said heater plate having one or more heating elements disposed thereon and arranged to thermally communicate with said heated tip;

said adapter flange having an upper side arranged to removably couple to said vacuum ported tool changer, and having one or more electrical contacts arranged to communicate with said heating elements;

said heated tip having a vacuum pickup portion for picking up said electronic components;

wherein apertures in each of said adapter flange said heater plate and said heated tip are arranged so as to communicate a vacuum from said vacuum ported tool changer to said vacuum pickup portion; and fastening means to hold said adapter flange and said heater plate and said heated tip together in close proximity.

2. The replaceable heated end effector as described in claim 1, wherein said heater plate is sandwiched between said adapter flange and said heated tip.

3. The replaceable heated end effector as described in claim 1, wherein said adapter flange is aluminum.

4. The replaceable heated end effector as described in claim 1, wherein said heated tip is aluminum.

5. The replaceable heated end effector as described in claim 1, wherein said apertures in said adapter flange said heater plate and said heated tip are coaxial.

6. The replaceable heated end effector as described in claim 1, wherein said vacuum pickup portion is a protrusion having a coaxial aperture to transmit the vacuum.

7. The replaceable heated end effector as described in claim 1, wherein said one or more electrical contacts are spring contacts arranged to exert a spring force on said heating elements.

8. The replaceable heated end effector as described in claim 1, further comprising a thermocouple for measuring the temperature of said heated tip.

9. The replaceable heated end effector as described in claim 1, further comprising a rotary electrical connector for making electrical connections between said electrical contacts and said high speed machine.

10. In a high speed machine for picking and placing electronic components, a replaceable heated end effector for connection to a vacuum ported tool changer, comprising:

a metal adapter flange, a heater plate and a heated metal tip;

said heater plate having one or more heating elements disposed thereon and arranged to thermally communicate with said heated metal tip;

said adapter flange having an upper side arranged to removably couple to said vacuum ported tool changer, and having one or more electrical contacts arranged to communicate with said heating elements by spring force;

said heated metal tip having a central vacuum pickup portion protruding from a bottom side for picking up said electronic components;

wherein apertures in said adapter flange said heater plate and said heated metal tip are coaxially arranged so as to communicate a vacuum from said vacuum ported tool changer to said vacuum pickup portion; and fastening means to sandwich said heater plate between said adapter flange and said heated tip.

11. The replaceable heated end effector as described in claim 10, further comprising a thermocouple for measuring the temperature of said heated tip.

12. The replaceable heated end effector as described in claim 10, further comprising a rotary electrical connector for making electrical connections between said electrical contacts and said high speed machine.

13. A heated vacuum tip to pick up and heat electronic parts being placed by a robotic placement machine, comprising:

an adapter plate arranged to removably connect to the robotic placement machine;

a metal vacuum tip for picking up the electronic parts by vacuum, an electric heater situated in thermal contact with the metal vacuum tip and energized by one or more electrical contacts in the adapter plate in order to heat the metal vacuum tip;

the metal vacuum tip heating the electronic parts while they are held in place against the tip by a vacuum transmitted from the robotic placement machine via apertures in the adapter plate, the heater and the metal vacuum tip.

14. The heated vacuum tip as described in claim 13, wherein the electric heater is sandwiched between the adapter plate and the metal vacuum tip.

15. The heated vacuum tip as described in claim 13, further comprising fastening means to hold said adapter plate and said electric heater and said metal vacuum tip together in close proximity.

16. The replaceable heated end effector as described in claim 13, further comprising a thermocouple for measuring the temperature of said metal vacuum tip.

17. The replaceable heated end effector as described in claim 13, further comprising a rotary electrical connector for making electrical connections between said electrical contacts and said high speed machine.

* * * * *